United States Patent [19]

Suzuki et al.

[11] 3,851,277

[45] Nov. 26, 1974

[54] ASTABLE MULTIVIBRATOR USING INSULATED-GATE FIELD EFFECT TRANSISTORS

[75] Inventors: Yasoji Suzuki, Kawasaki; Eiichi Yamaga, Minami Hatogaya, both of Japan

[73] Assignee: Tokyo Shibaura Electric Company, Ltd., Kawasaki-shi, Kanagawa-ken, Japan

[22] Filed: Dec. 27, 1972

[21] Appl. No.: 318,712

[52] U.S. Cl. .......................... 331/113 R, 331/108 D

[51] Int. Cl. ........................................... H03k 3/282

[58] Field of Search ............ 331/108 C, 108 D, 111, 331/113 R; 307/279

[56] References Cited

UNITED STATES PATENTS

| | | | |
|---|---|---|---|
| 3,509,379 | 4/1970 | Rapp | 307/279 |
| 3,512,106 | 5/1970 | Rosenthal | 331/111 |
| 3,560,998 | 2/1971 | Walton | 331/113 R |
| 3,562,559 | 2/1971 | Rapp | 331/113 R |

*Primary Examiner*—John Kominski
*Attorney, Agent, or Firm*—Oblong, Fisher, Spivak, McClelland & Maier

[57] ABSTRACT

A high frequency astable multivibrator comprises an R–C time constant circuit and an odd number of inverters, for example three, and contains either complementary pair type or same channel conductivity type insulated-gate field effect transistors.

9 Claims, 5 Drawing Figures

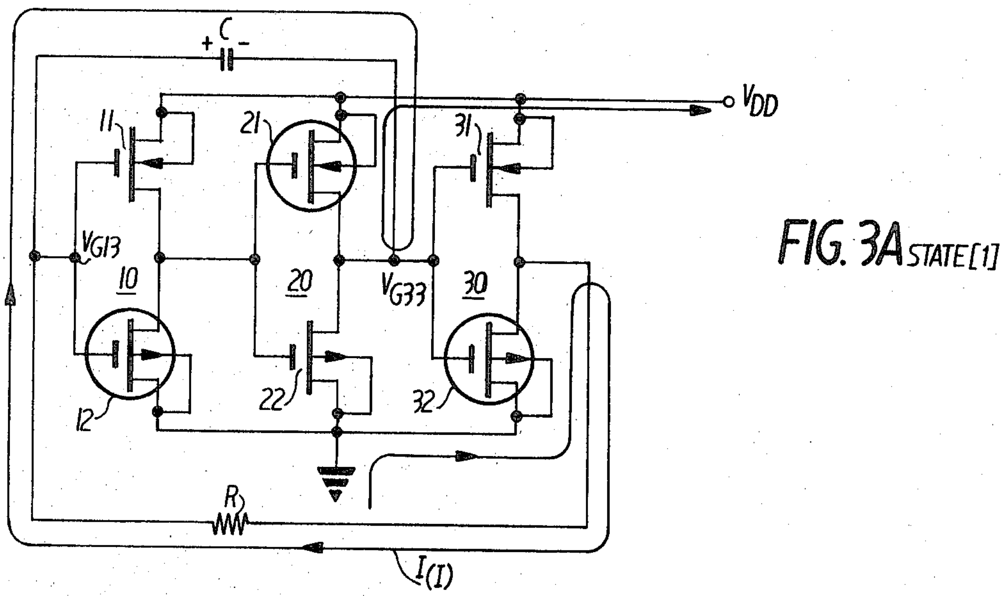
FIG. 3A STATE [1]
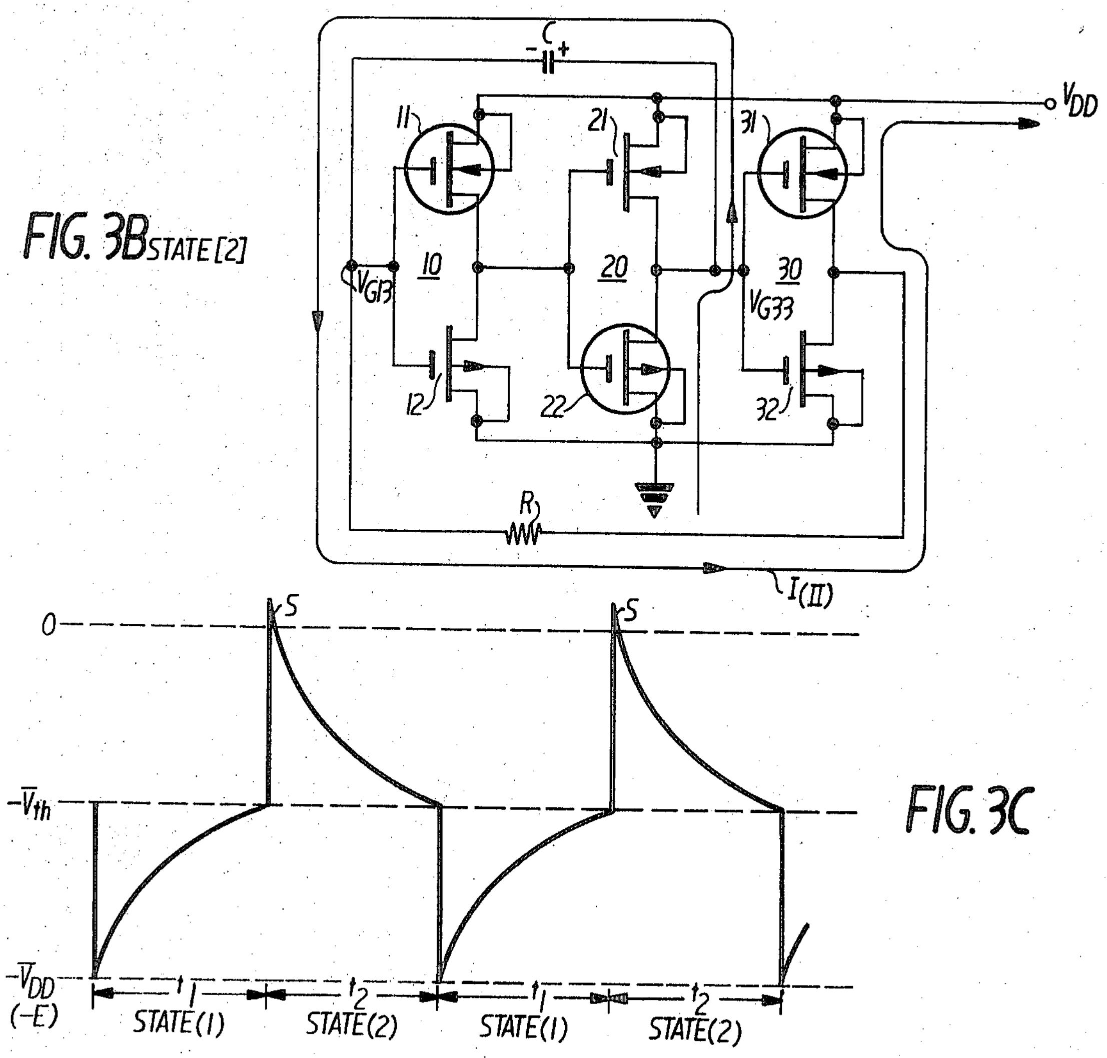
FIG. 3B STATE [2], FIG. 3C

ASTABLE MULTIVIBRATOR USING INSULATED-GATE FIELD EFFECT TRANSISTORS

BACKGROUND OF THE INVENTION

1. Field of the Invention

The present invention generally relates to an astable multivibrator and more particularly to a high frequency astable multivibrator comprised of cascade connected insulated-gate field effect transistor inverters.

2. Description of the Prior Art

There are various types of field effect transistors, for example, the metal-oxide semiconductor type, which are more advantageously fabricated in high density integrated circuits than are other type transistors. The metal-oxide semiconductor (MOS) field effect transistor, hereinafter called insulated-gate field effect transistor (IGFET), comprises a body of semiconductor material having a source and a drain in contact with the body defining a conductive channel, and further comprises a gate which overlies at least a portion of the conductive channel and separated therefrom by an insulator. One prior art astable multivibrator using the IGFET has previously been described in U.S. Pat. No. 3,568,091. That device comprised a pair of inverters and a timing circuit including a capacitor and a resistor. When it was desired to increase the oscillation frequency thereof, the values of the capacitor and resistor of the device had to be decreased. As the values of the capacitor and resistor were decreased, at some point the input and output of the device would become virtually a short circuit and oscillation would terminate. Therefore it was difficult to increase the oscillation frequency of the device while sustaining a stable oscillation.

SUMMARY OF THE INVENTION

Accordingly, one object of the present invention is to provide a new and improved unique high frequency astable multivibrator using IGFETs.

Another object of this invention is to provide a new and improved unique astable multivibrator having stable oscillation operation at high frequencies.

A further object of this invention is to provide a new and improved unique multivibrator which operates at an accurate oscillation frequency.

A further object of the invention is to provide a new and improved unique multivibrator having a simple timing circuit whose time constant is easy to control to obtain a predetermined value.

One other object of this invention is to provide a new and improved unique multivibrator fabricated as an integrated circuit of small pattern size.

Briefly, in accordance with the present invention, the foregoing and other objects are in one aspect attained by providing an astable multivibrator using IGFETs comprising cascade connected inverters consisting of an odd number of stages, more than one, having an input and an output. The inverters may consist of IGFETs of either the same channel conductivity type or complementary channel conductivity type. A resistor is connected between the input of the first stage of the inverter and the output of the final stage of the inverter, and a capacitor is connected between the input of the final stage of the inverters and the input of the first stage of the inverter.

BRIEF DESCRIPTION OF THE DRAWINGS

A more complete appreciation of the invention will be readily obtained as the same becomes better understood by reference to the following detailed description when considered in connection with the accompanying drawings, wherein:

FIG. 3(*a*) is a circuit diagram which shows the current flow of one operational state of the circuit of FIG. 1;

FIG. 3(*b*) is a circuit diagram which shows the current flow of the other operational state of the circuit of FIG. 1; and FIG. 3(*c*) is a timing chart which shows the timing operation of the circuit of FIG. 1.

DETAILED DESCRIPTION OF THE PREFERRED EMBODIMENTS

Figure 1:
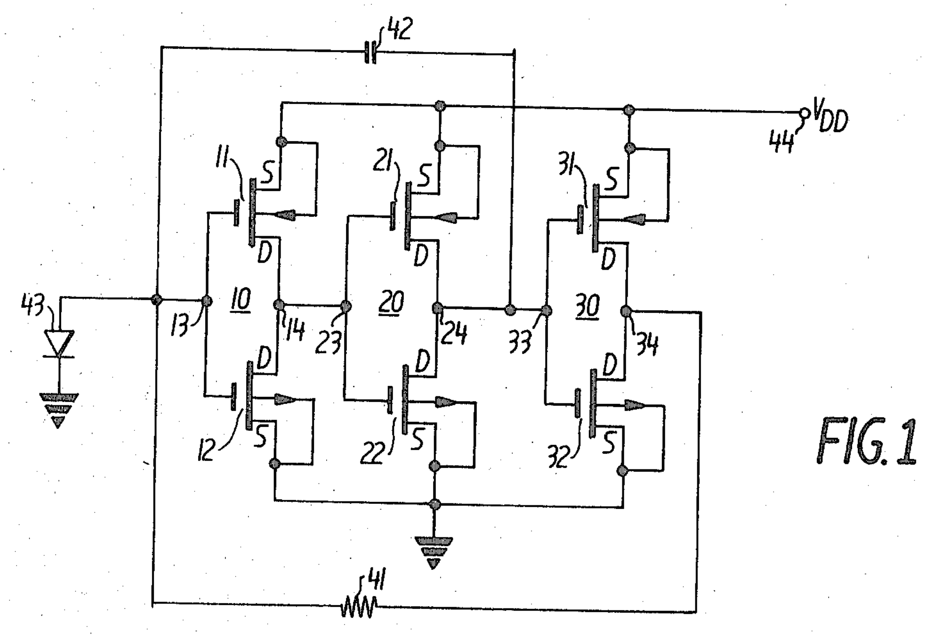
FIG. 1 is a circuit diagram of one embodiment of the invention which has three inverters having complementary IGFETs.

Referring now to the drawings, wherein like reference numerals designate identical or corresponding parts throughout the several FIGURES, and more particularly to FIG. 1 thereof, wherein a circuit diagram of the astable multivibrator of the present invention is shown. The multivibrator comprises three inverters 10, 20 and 30 and a timing circuit comprising a resistor 41 and a capacitor 42. The inverters 10, 20 and 30 are connected in cascade and each have a pair of complementary channel conductivity type IGFETs 11, 12, 21, 22, 31 and 32, respectively. The channels of the IGFETs 11 and 12 are connected in series between ground potential G and a negative source potential $V_{DD}$ at terminal 44. The drains of the IGFETs 11 and 12 are connected together by a connection 14 to form an output of the inverter 10. The other inverters 20 and 30 are connected in the same manner as the inverter 10. More specifically, the inverter 20 has an input 23 and an output 24 and the inverter 30 has an input 33 and an output 34. The connections between the output 14 of the inverter 10 and the input 23 of the inverter 20, and between the output 24 of the second inverter 20 and the input 33 of the third inverter 30 form a cascade connection of the inverters 10, 20 and 30. The IGFETs 11, 21 and 31 are, thereupon, N-channel IGFETs whose substrate electrodes are connected to the source $V_{DD}$ at terminal 44. The IGFETs 12, 22 and 32 are, thereupon, P-channel IGFETs whose substrate electrodes are connected to ground potential G. Both connections supply a negative bias potential to each IGFET to stabilize the operation of the circuit. The substrate electrodes are shown as arrows in FIG. 1. The source and drain electrodes are shown as symbols "S" and "D," respectively. On the other hand, the timing circuit is formed of the resistor 41 which is connected between the output 34 of the third inverter 30 and the input 13 of the first inverter 10 and the capacitor 42 which is connected between the common connection of the input 24 and the output 33 and the input 13 of the first inverter 10.

The operation of the multivibrator circuit set forth will be hereinafter described as follows. In order to clarify the explanation it it assumed that all of the P- and N- channel IGFETs 11, 12, 21, 22, 31 and 32 act as being in the "ON" state in its saturation area, that a pair of complementary IGFETs 11 and 12 of the first inverter 10 have a state whether IGFET 11 is in the "ON" state when IGFET 12 is in the "OFF" state or IGFET 11 is in the "OFF" state when IGFET 12 is in the "ON" state and that the other inverters 20 and 30 also have the same state as the first inverter 10. The states of operation may be separated into state [I] and state [II]. The state [I] corresponds to FIG. 3(*a*) and the state [II] corresponds to FIG. 3(*b*). In the state [I], with respect to the third inverter 30, the potential $V_{G33}$ of the input 33 of the third inverter 30 is equal to an applied negative potential when IGFET 31 is "OFF" and IGFET 32 is "ON" by means of supplying $V_{DD}$ with the negative potential as shown in FIG. 3(*a*). The IGFET, for example IGFET 32, is indicated with the mark of a circle when in its "ON" state. In this case, the current $I_{(I)}$ will flow through the capacitor C and the capacitor C can be charged with a polarity as shown in FIG. 3(*a*). Namely, in the initial duration of the charging of capacitor C, a potential $V_{G13}$ at the input 13 of the first inverter 10 is slightly less than $V_{DD}$ due to the voltage drop of the resistor 41. IGFET 12 will then be initially "ON" and IGFET 11 "OFF" and IGFET 21 will be initially "ON" and IGFET 22 "OFF" as shown in FIG. 3(*a*). Subsequently, the current $I_{(I)}$ through the capacitor C decreases in accordance with the charging of the capacitor C. The current $I_{(I)}$ through the resistor R causes a voltage drop across the resistor R to decrease. As a consequence, the negative potential $V_{G13}$ exponentially rises toward ground potential O as shown in FIG. 3(*c*). When the gate potential $V_{G13}$ rises over a logical threshold level $V_{th}$ of the first inverter 10, IGFET 11 turns "ON" and IGFET 12 "OFF." The state [I] of the circuit will then change to the state [II]. Namely, the output potential of the first inverter 10 changes the state of the second inverter 20 so that the IGFET 21 turns "OFF" and the IGFET 22 turns "ON." The gate potential $V_{G33}$ of the third inverter 30 will then be at the ground potential O. Therefore the IGFET 31 turns "ON" and the IGFET 32 turns "OFF," and the current $I_{(II)}$ through the capacitor C flows as shown in FIG. 3(*b*). FIG. 3(*c*) shows the gate potential $V_{G13}$ during the state [I] and state [II]. The terms $t_1$ and $t_2$ are half cycle durations of a complete periodic cycle corresponding to the state [I] and the state [II], respectively. The current $I_{(II)}$ begins to discharge the capacitor C and the gate potential $V_{G13}$ rises to a positive potential as shown in FIG. 3(*c*). Usually a positive area S as shown in FIG. 3(*c*) is clamped by a diode 43 for protection, as shown in FIG. 1. After the discharging of the capacitor C the current $I_{(II)}$ decreases exponentially so as to again charge the capacitor C with a polarity opposite to that of the state [I]. When the gate potential $V_{G13}$ is under the threshold level $V_{th}$, the IGFET 11 turns "OFF" and the IGFET 12 is "ON." The IGFET 21 then turns ON" and the IGFET 22 turns "OFF." Therefore, the gate potential $V_{G33}$ is equal to the negative bias supply potential $V_{DD}$. As a result, the circuit returns from the state [II] to the state [I] and one cycle of oscillation is performed. The oscillation frequency may be determined as will now be described.

The values of the resistor R and the capacitor C are indicated in the following equations as R and C, and the frequency is indicated as *f*. In FIG. 3(*b*) the charging current $I_{(II)}$ is $$I_{(I)} = (-V_{DD}/R)\ \exp\ (-t/CR) \qquad (1)$$

$$V_{G13} = V_{DD}\ [1 - \exp\ (-t/CR)] \qquad (2)$$

When $V_{G13} = V_{th}$, the state will change, then equation 2, where $t = t_2$ is $$t_2 = RC\ ln\ \{(1/1 - V_{th}/V_{DD})\} \qquad (3)$$

When the state is transferred from (II) to (I), the voltage across the capacitor 42 is equal to $V_{th}$ and the charging current $[I_{(I)}]$ is $$I_{(I)} = (V_{DD} + V_{th}/R)\ \exp\ (-t/CR) \qquad (4)$$

Now equation 2 where $t = t_1$ is $$t_1 = CR\ n\ [(V_{DD} + V_{th}/V_{th})] \qquad (5)$$

It should be clear that from the equations 3 and 5, the frequency *f* is:

$$f = \frac{1}{T} = \frac{1}{t_1 + t_2} = \frac{1}{CR\ \ln\left\{\frac{V_{DD} V_{DD} + V_{th}}{V_{th} V_{DD} - V_{th}}\right\}} \qquad (6)$$

The above described embodiment comprises only three inverters, but it is apparent that the number of the cascade connected inverters can be any odd number, more than one, from the principal of this invention. If five inverters, for example, are used, the timing circuit comprising the capacitor and resistor are connected between the first stage and the final stage of the inverters. Therefore, it is possible to control the time constant of the multivibrator for high frequency, for example, several megahertz, by means of the timing circuit. If the values of both the resistor and the capacitor are O, then the cascade connected inverters can oscillate with a frequency (*tapd* × N) where N is the number of the inverters and (*tapd*) is the average propagation delay time of each inverter.

Figure 2:
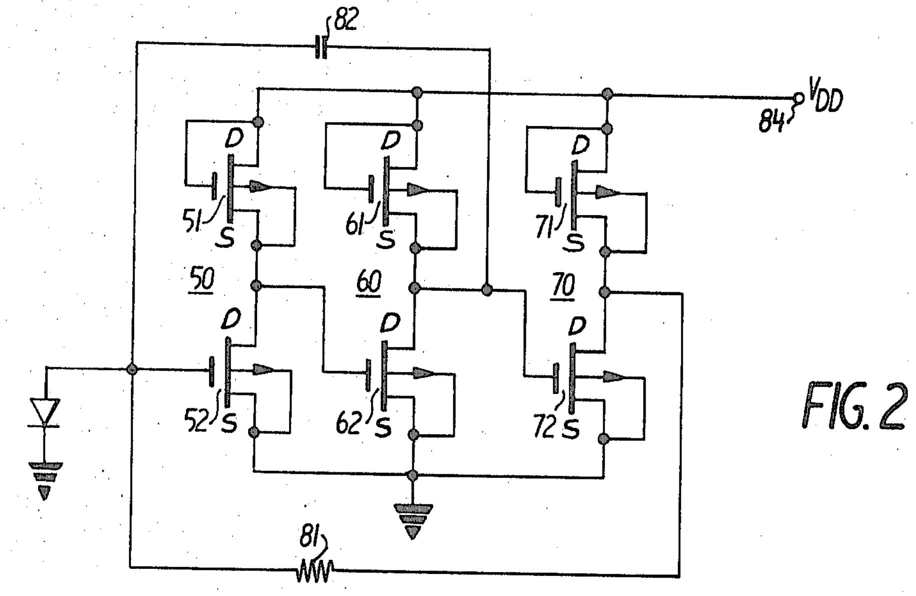
FIG. 2 is a circuit diagram of another embodiment of the invention which has three inverters having P-channel IGFETs.

FIG. 2 illustrates another embodiment of the present invention which uses P-channel IGFETs for the inverters instead of the pair of complementary IGFET pairs as in FIG. 1. The first, second and third inverters 50, 60 and 70 each comprises a pair of P-channel IGFETs 51, 52, 61, 62, 71 and 72, respectively. The resistor 81 of the timing circuit is connected between the common series connection of the third inverter 70 and the gate of the IGFET 52. The capacitor 82, another element of the timing circuit, is connected between the common series connection of the second inverter 60 and the gate of the IGFET 52. The operation of the multivibrator of FIG. 2 is equivalent to the embodiment of FIG. 1. The multivibrator using P-channel IGFETs has advantages in that fabrication steps are more simple and the size of each element is smaller with respect to the multivibrator using complementary IGFETs. On the other hand, the multivibrator using complementary IG- FETs has advantages in that the power of dissipation of the circuit is smaller and its high frequency operation is more stable with respect to the multivibrator using P-channel IGFETs. In the above mentioned multivibrator, it is possible to use N-channel IGFETs instead of P-channel IGFETs.

Obviously, numerous modifications and variations of the present invention are possible in light of the above teachings. It is therefore understood that within the scope of the appended claims, the invention may be practiced otherwise than as specifically described herein.

What is claimed as new and desired to be secured by Letters Patent of the United States is:

1. An astable multivibrator comprising:
- a first inverter having a first transistor and a second transistor, said first transistor having a gate, a source and a drain, said second transistor having a gate, a source and a drain, a second inverter having a third transistor and a fourth transistor, said third transistor having a gate, a source, and a drain, said fourth transistor having a gate, a source and a drain,
- a third inverter having a fifth transistor and a sixth transistor, said fifth transistor having a gate, a source and a drain, said sixth transistor having a gate, a source and a drain,
- means connecting the gate of said first transistor to the gate of said second transistor,
- means connecting the gate of said third transistor to the gate of said fourth transistor,
- means connecting the gate of said fifth transistor to the gate of said sixth transistor,
- means connecting the drain of said first transistor to the drain of said second transistor,
- means connecting the drain of said third transistor to the drain of said fourth transistor,
- means connecting the drain of said fifth transistor to the drain of said sixth transistor,
- means connecting the sources of said first, third and fifth transistors to a voltage source,
- means for connecting the sources of said second, fourth and sixth transistors to ground,
- means connecting the drains of said first and second transistors to the gates of said third and fourth transistors,
- means connecting the drains of said third and fourth transistors to the gates of said fifth and sixth transistors,
- a resistor connected between the gates of said first and second transistors and the drains of said fifth and sixth transistors, and
- a capacitor connected between the gates of said first and second transistors and the gates of said fifth and sixth transistors.

2. An astable multivibrator in accordance with claim 1 wherein said first and second transistors comprise a pair of complimentary channel conductivity type insulated-gate field effect transistors, said third and fourth transistors comprise a pair of complimentary channel conductivity type insulated-gate field effect transistors and said fifth and sixth transistors comprise a pair of complimentary channel conductivity type insulated-gate field effect transistors.

3. An astable multivibrator in accordance with claim 1, wherein said first, third and fifth transistors comprise N-channel conductivity type insulated-gate field effect transistors and said second, fourth and sixth transistors comprise P-channel conductivity type insulated gate field effect transistors.

4. An astable multivibrator in accordance with claim 3, wherein said first, second, third, fourth, fifth and sixth transistors comprise metal-oxide semiconductor transistors.

5. An astable multivibrator comprising:
- a first inverter having a first transistor and a second transistor, said first transistor having a gate, a source and a drain, said second transistor having a gate, a source and a drain,
- a second inverter having a third transistor and a fourth transistor, said third transistor having a gate, a source and a drain, said fourth transistor having a gate, a source and a drain,
- a third inverter having a fifth transistor and sixth transistor, said fifth transistor having a gate, a source and a drain, said sixth transistor having a gate, a source and a drain,
- means connecting the source of said first transistor to the drain of said second transistor,
- means connecting the source of said third transistor to the drain of said fourth transistor,
- means connecting the source of said fifth transistor to the drain of said sixth transistor,
- means connecting the drains of said first, third, and fifth transistors to a voltage source,
- means connecting the sources of said second, fourth and sixth transistors to ground,
- means connecting the gates of said first, third and fifth transistors to said voltage source,
- means connecting the source of said first transistor and the drain of said second transistor to the gate of said fourth transistor,
- means connecting the source of said third transistor and the drain of said fourth transistor to the gate of said sixth transistor,
- a resistor connected between the gate of said second transistor and the source of said fifth transistor and the drain of said sixth transistor, and
- a capacitor connected between the gate of said second transistor and the gate of said sixth transistor.

6. An astable multivibrator in accordance with claim 5, wherein said first, second, third, fourth, fifth and sixth transistors comprise P-channel conductivity type insulated-gate field effect transistors.

7. An astable multivibrator in accordance with claim 5, wherein said first, second third, fourth, fifth and sixth transistors comprise N-channel conductivity type insulated-gate field effect transistors.

8. An astable multivibrator in accordance with claim 6, wherein said first, second, third, fourth, fifth and sixth transistors comprise metal-oxide semiconductors.

9. An astable multivibrator in accordance with claim 7, wherein said first, second, third, fourth, fifth and sixth transistors comprise metal-oxide semiconductors.

* * * * *